United States Patent
Kimura et al.

(10) Patent No.: US 7,052,367 B2
(45) Date of Patent: *May 30, 2006

(54) POLISHING APPARATUS

(75) Inventors: Keiichi Kimura, Kanagawa (JP); Takashi Miyoshi, Osaka (JP)

(73) Assignee: Sony Corporation (JP)

( * ) Notice: Subject to any disclaimer, the term of this patent is extended or adjusted under 35 U.S.C. 154(b) by 154 days.

This patent is subject to a terminal disclaimer.

(21) Appl. No.: 10/806,220

(22) Filed: Mar. 23, 2004

(65) Prior Publication Data

US 2004/0180607 A1    Sep. 16, 2004

Related U.S. Application Data

(62) Division of application No. 10/390,769, filed on Mar. 19, 2003, now Pat. No. 6,761,616.

(30) Foreign Application Priority Data

Mar. 20, 2002   (JP)   ............................. 2002-079163

(51) Int. Cl.
*B24B 1/00* (2006.01)
(52) U.S. Cl. ..................... 451/6; 6/451; 6/36; 6/285
(58) Field of Classification Search ............... 451/5–8, 451/29, 285–290
See application file for complete search history.

(56) References Cited

U.S. PATENT DOCUMENTS

| | | | |
|---|---|---|---|
| 5,212,382 A | 5/1993 | Sasaki et al. | |
| 5,461,007 A | 10/1995 | Kobayashi | |
| 6,048,255 A | 4/2000 | Kuo et al. | |
| 6,319,093 B1 * | 11/2001 | Lebel et al. | 451/6 |
| 2002/0058461 A1 | 5/2002 | Kimura et al. | |
| 2003/0171081 A1 * | 9/2003 | Komukai et al. | 451/6 |

FOREIGN PATENT DOCUMENTS

JP    11-288906    10/1999

* cited by examiner

*Primary Examiner*—Hadi Shakeri
(74) *Attorney, Agent, or Firm*—Rader, Fishman & Grauer PLLC; Ronald P. Kananen

(57) ABSTRACT

In a planarization process with a CMP method for a work surface having very small protrusions and depressions thereon at a semiconductor process, a polishing method is provided which achieves high flatness by selectively polishing and removing the protrusions. Relating to the planarization process, such as a CMP processing or an aspheric lens polishing process, the polishing method is performed by forming an aggregation trace of particles on the work surface by irradiating laser light. More specifically, a region where the laser light to be irradiated is the depressions adjacent to the protrusions, and the irradiated laser light forms the aggregation trace of particles within the depression, thereby controlling the amount of removal material at a fine region to allow selective polishing of the protrusions.

3 Claims, 8 Drawing Sheets

POLISHING ON
SURFACE HAVING
DEPRESSIONS

POLISHING ON
FILLED-UP SURFACE

POLISHING APPARATUS

CROSS REFERENCE TO RELATED APPLICATIONS

This application is a divisional of application Ser. No. 10/390,769 filed on Mar. 19, 2003 and issued as U.S. Pat. No. 6,761,616 on Jul. 13, 2004.

The present document is based on Japanese Priority Document JP2002-079163, filed in the Japanese Patent Office on Mar. 20, 2002, the entire contents of which are incorporated herein by reference.

BACKGROUND OF THE INVENTION

1. Field of the Invention

The present invention relates to a polishing method and a polishing apparatus and, more particularly, to a polishing method and a polishing apparatus which polish a work surface still having an unevenness thereon with slurry-containing particles.

2. Description of the Related Art

As disclosed in Japanese Patent Application Laid-Open No. 11-288906, a CMP (Chemical Mechanical Polishing) method has widely been used conventionally in the process of planarizing a semiconductor wafer substrate.

Especially, an enhanced integration degree of VLSI circuits causes an increase in number of wiring layers, and improving the planarization process with a CMP method is strongly required. The planarization process can be possible by realizing selective polishing on the protrusions of a surface. Conventionally, a polishing pad is pressed to the surface at constant pressure so as to increase the speed at which the protrusions are selectively polished and removed with the aid of the pressure-distribution difference between the protrusions and depressions. However, since the method cannot produce a sufficient difference in the pressure distribution, there is a limitation on the ability to reduce unevenness. Thus, a method which actively allows a material process in an arbitrary fine region has been needed.

As shown in FIG. 1, the conventional CMP method involves adhering and fixing an elastic polishing pad 12 onto a rotating polishing plate 11. A silicon wafer 13 is fixed to an end face of a polishing head 14. The silicon wafer 13 is fixed by compression to the polishing pad 12, with its surface to be polished facing downward. Slurry 15 is supplied in this state, the polishing plate 11 is rotated and the polishing head 14 is also rotated to polish the surface of the silicon wafer 13.

At this time, since the polishing pad 12 is in contact with the silicon wafer 13 with pressure exerted on each other, the slurry 15 is not sufficiently flowed into the polishing region and results in unstable polishing. To prevent this, the surface of the polishing pad 12 is dressed with a diamond tool or the like so as to make relatively large protrusions and depressions for slurry pools. Thus, because the surface of the polishing pad 12 is made of an elastic material, it becomes fuzzy due to the protrusions and depressions for the slurry pools and scratching with the dressing tool.

As shown in FIG. 2, the silicon wafer 13 to be polished with the CMP method shown in FIG. 1 has regular protrusions and depressions of conductive metal at a surface layer, such as wiring pattern 21, and a thin film layer 22 serving as an insulating film made of $SiO_2$ formed over the protrusions and depressions. Affected by the protrusions and depressions of the wiring pattern 21, protrusions and depressions are generated at the surface of the thin film layer 22. In the planarizing process with the CMP method, selectively polishing on only the protrusions 23 of the protrusions and depressions of the thin film layer 22 achieves a surface planarization.

Attempts have been made to bring the polishing pad 12 into contact only with the protrusions on the surface of the silicon wafer 13 to perform polishing by increasing the elasticity of the polishing pad 12, by way of example. Actually, however, as shown in FIG. 3, because the polishing pad 12 is formed of an elastic body which is deformed under pressure and its surface is fuzzy, the surface of the polishing pad 12 contacts not only the protrusions 23 of the thin film layer 22 but also the depressions. In other words, it is difficult to perform selectively polishing on only the protrusions 23.

For this reason, it is difficult to achieve an ideal planarization process which largely removes material including only the protrusions 23, as shown by a removed region 24 in FIG. 4, and selectively removes the protrusions 23. Specifically, in reality, there exists a problem that the removed region 24 has a substantially uniform thickness regardless of the presence of the protrusions and depressions, as shown in FIG. 5, to substantially and uniformly polish the protrusions and depressions of the thin film layer 22 made of $SiO_2$ formed on the surface of the silicon wafer 13 even with the progression of the polishing, thereby preventing successful planarization.

When planarizing a surface having protrusions and depressions thereon, it is necessary to selectively remove only the protrusions. In a typical CMP, however, since the surface of the polishing pad has large protrusions and depressions for holding slurry and is dressed to have fuzz as fibers, the polishing pad is not in contact uniformly with the silicon wafer. When the protrusions are removed with the progression of the polishing, the depressions are also simultaneously removed, although the removed amount is smaller. For this reason, planarization in a short time is difficult in polishing the surface having the protrusions and depressions. Also, even when polishing the surface is performed in a long time, a favorable planarized surface is difficult to achieve although its steps are reduced.

This phenomenon is also seen in the processing of an aspheric lens. Specifically, in general, a high precision grinding process is performed to form a desired aspheric shape on the surface of a lens, and then a polishing process is performed to remove a surface damage layer and ensure surface roughness as an optics device simultaneously.

In the polishing process, even when measurements are made previously to calculate polishing regions and removing amounts at those regions, the shape of the region to be removed through the polishing has a certain area and thus its surroundings are processed at the same time, meaning that regions other than the intended region are subjected to processing. As a result, the polishing process deteriorates the accuracy achieved through the grinding process.

In view of the above-described problems, the present inventors have proposed a method, as shown FIG. 6, in Japanese Patent Application Laid-Open No. 2000-289444. The method can be carried out local and selective polishing of the protrusions 23 of the thin film layer 22 formed on the silicon wafer 13 by selectively irradiating laser light to the protrusions 23, so as to form an aggregation trace of particles of the slurry there, and then performing polishing to break the aggregation trace of particles to result in a high concentration of the slurry in a local region.

According to the above-mentioned method, however, most of the polishing time is spent on polishing the aggregation trace, and an only extremely short time is spent on removing the material of the protrusions 23 immediately before the aggregation trace is eliminated. Thus, the method has the disadvantages of an insufficient ability of planarization and a low efficiency of planarization.

SUMMARY OF THE INVENTION

The present invention has been made in order to solve or alleviate such problems, and there is a need to provide a polishing method and a polishing apparatus which polish a work surface having protrusions and depressions thereon to efficiently achieve a target flat or curved surface by polishing and removing a relatively large material amount of the protrusions.

The present invention relating to the polishing method provides a method of polishing a work surface having protrusions and depressions thereon with slurry containing particles, comprising the steps of:

forming an aggregation trace within the depressions by collecting the particles of the slurry through irradiating laser light to the depressions existing adjacent to or in the vicinity of the protrusions where a selectively larger removal material amount is desired during the polishing process, whereby regions having the aggregation trace become substantially the same height as the protrusions; and planarizing by polishing the regions having the aggregation trace and the protrusions together so as to remove a substantially uniform material amount.

Preferably, the aggregation trace of the particles is formed within the depressions of the work surface by determining a path on which laser light flux moves in accordance with the shape of the protrusions and depressions of the work surface to perform scanning. Alternatively, the aggregation trace of the particles is preferably formed within the depressions of the work surface by laser light irradiation through a light shield mask, the light shield mask is arranged in accordance with the shape of the protrusions and depressions of the work surface and placed in the path of laser light. In addition, preferably, the aggregation trace of the particles is formed in a region irradiated with laser light of the work surface by trapping and collecting the particles of the slurry through a laser trapping phenomenon with light radiation pressure, the formed aggregation trace of the particles is broken by polishing and the particles are used as polishing particles, so that the particles are concentrated near the region irradiated with laser light, and then an amount of removal material by polishing near the aggregation trace of the particles is increased. It is also preferable that the shape of a surface of a region to be polished on the work surface is measured and stored before or during polishing. A laser light irradiation position, an irradiation condition, and a polishing condition are calculated from the measurement data, and laser light irradiation is performed in accordance with the calculation results.

One aspect of the present invention relating to the polishing apparatus provides a polishing apparatus for polishing a work surface having protrusions and depressions thereon with slurry containing particles, including:

a laser optical system for projecting and irradiating laser light; and a polishing tool system for performing pressing in an axis direction and rotational movement, wherein irradiation of laser light and polishing are performed on the depressions adjacent to the protrusions of the work surface simultaneously and sequentially by relative movement of the laser optical system and the polishing tool system to the work surface.

It is preferable that the shape of the surface of a region to be polished on the work surface is measured by shape measuring means before or during polishing, the measured shape is stored by storing means. A laser light irradiation position, an irradiation condition, and a polishing condition are calculated from the stored measurement data. Based on the calculation result, the laser optical system irradiates a laser to the depressions adjacent to the protrusions or the polishing tool system polishes the protrusions and the depressions. In addition, a light shield mask is placed in the optical path of the laser optical system in order to irradiate laser light selectively in accordance with the shape of the protrusions and the depressions of the work surface.

When forming the aggregation trace by the laser trapping phenomenon and improving the flatness of the work surface such as a silicon wafer using the aggregation trace, in order to remove only the material of the protrusions during the polishing process, a mask may be provided on the material of the depressions for protection. FIG. 8 shows the concept of a planarization process based on such an idea, that is, an LAFP (Laser Aggregation, Filling-up & Polishing) method.

After laser light flux is irradiated to the depressions of the protrusions and depressions of the surface of the silicon wafer and forms the aggregation trace selectively to fill up the depressions, polishing is performed on the region where the aggregation trace is formed. When the aggregation trace is not formed, polishing causes removal of the depressions, and the steps of the protrusions and depressions are not eliminated. However, when the aggregation trace is formed to fill up the depressions by the LAFP method, polishing is performed maintaining flatness. The final polishing surface no longer has the original shape of the surface having the protrusions and depressions, and a planarized surface is formed.

When the specific region of the workpiece is polished with the small tool by the above-mentioned LAFP method, the polishing can be performed with high precision regional resolutions. In the CMP planarization process for the surface having fine protrusions and depressions thereon in the semiconductor process, selectively polishing on the protrusions can be possible. As a result, high flatness can be obtained. Also, planarization of the interlayer insulating film mainly made of a $SiO_2$-based material can be possible. In addition, planarization of an insulating layer over a metal film made of Cu or the like can be possible. Such a technique is capable of being applied to high precision polishing of an aspheric lens or the like, so that polishing the aspheric lens with high precision can be possible.

Therefore, according to the polishing method of the present invention, in the planarization process of the work surface having the protrusions and depressions, removing the protrusions selectively by polishing is especially possible and high flatness can be achieved.

According to the polishing apparatus of the present invention, it is possible to perform selectively irradiation with laser light and polishing simultaneously or sequentially on depressions adjacent to the protrusions on the work surface. Therefore, a polishing apparatus capable of polishing achieving high flatness by selectively polishing the specific region on the work surface can be provided.

DESCRIPTION OF THE PREFERRED EMBODIMENT

Figure 1:
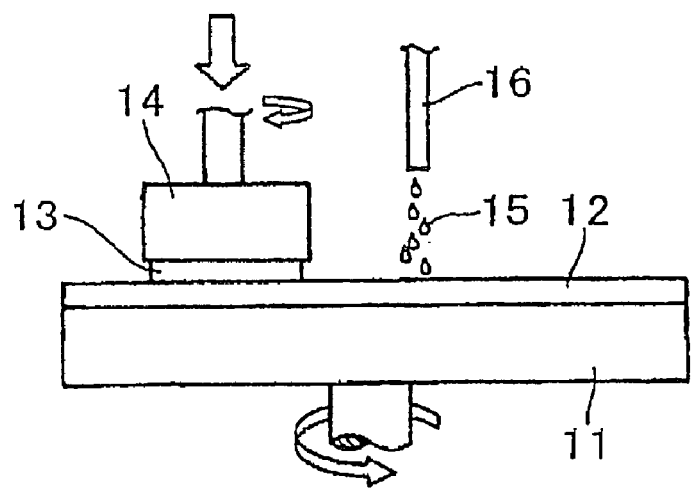
FIG. 1 is a front view illustrating a CMP method.
Figure 2:
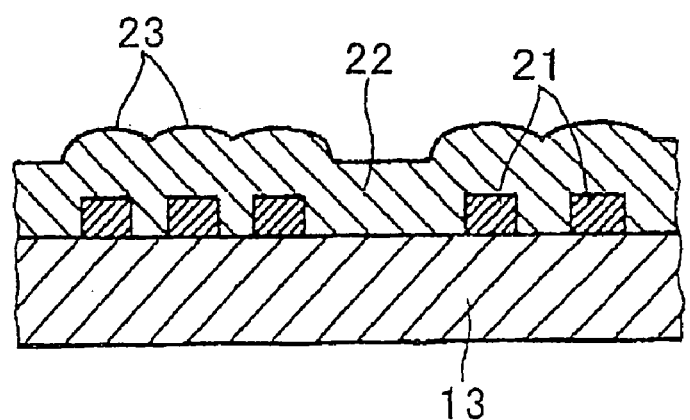
FIG. 2 is an enlarged sectional view showing main regions of a silicon wafer having a wiring pattern and an insulating thin film layer formed on its surface.
Figure 4:
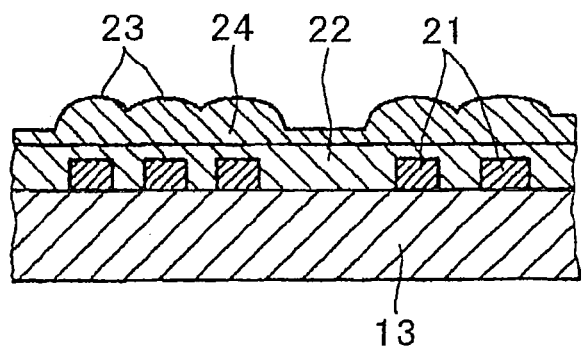
FIG. 4 is an enlarged sectional view of main regions of the silicon wafer illustrating ideal polishing of the thin film layer.
Figure 5:
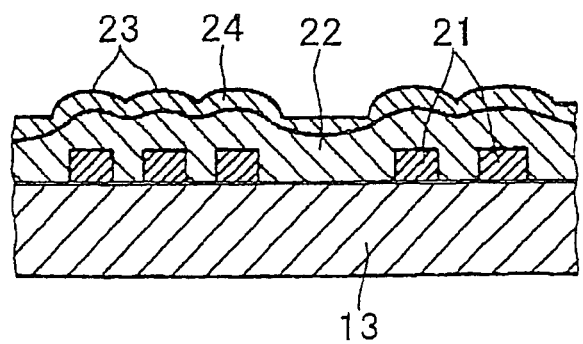
FIG. 5 is an enlarged sectional view of main regions of the silicon wafer illustrating a conventional polishing of the thin film layer.
Figure 6:
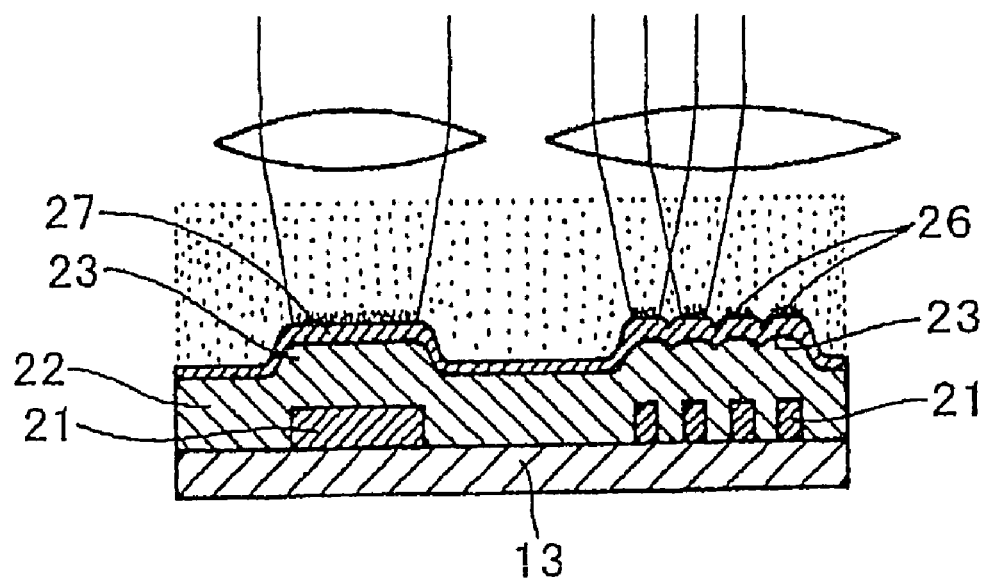
FIG. 6 is an enlarged sectional view of main regions of the silicon wafer illustrating irradiation of laser light in a conventional CMP method.

In an embodiment of the present invention, when the silicon wafer 13 made of Si having the metal wiring pattern 21 and the insulating layer 22 made of $SiO_2$ formed thereon, for example, as shown in FIG. 2, is polished with the CMP method, as shown in FIG. 1, an amount of removal material by polishing at regions including the protrusions 23 is relatively increased, as shown in FIG. 4, in order to planarize the surface into a target flat surface, rather than removing the substantially uniform material amount 24 from all over the regions including the protrusions and depressions, as shown in FIG. 5.

Figure 3:
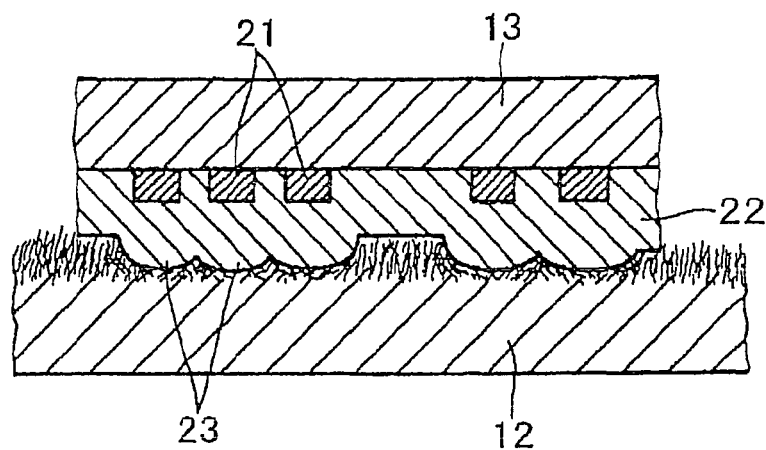
FIG. 3 is an enlarged sectional view of main regions of the silicon wafer illustrating a polishing of the thin film layer.

The interlayer insulating film 22 made of $SiO_2$ on the silicon wafer 13 shown in FIG. 2 has fine protrusions and depressions forming steps having, for example, height differences of approximately 400 to 500 nm and positioned at intervals of several 100 nm to several 100 μm due to the influence of the existence of the wiring pattern 21 under the interlayer insulating film 22. To planarize the interlayer insulating film 22 in this event, polishing is performed as shown in FIG. 4 to achieve an ideal shape. The ideal shape can be obtained by relatively and selectively polishing only the protrusions 23 of the protrusions and depressions of the surface. As described in FIG. 3, however, selectively contacting the polishing pad 12 only with the protrusions 23 for polishing cannot be made according to the conventional method. Thus, since selective polishing only of the protrusions 23 is extremely difficult, only a polishing method such as shown in FIG. 5 has been able to be performed.

In the embodiment, as a method of selectively polishing only the protrusions 23 of the protrusions and depressions of the surface of the interlayer insulating film 22, laser light is selectively irradiated to depressions 50 adjacent to the protrusions 23 existing in the regions where a relatively large removal amount is desired on the surface of the workpiece. Then, polishing the laser light irradiated regions with the slurry 15 containing particles for polishing is conducted so as to increase the amount of removal material at those regions.

Figure 8A:
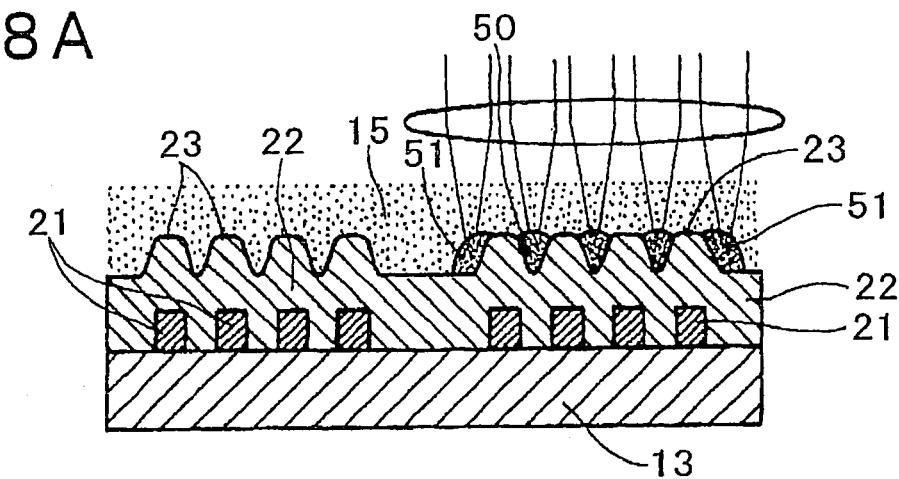
FIGS. 8A and 8B are an enlarged sectional views illustrating selective irradiation of laser light to the thin film layer on the silicon wafer.
Figure 8B:
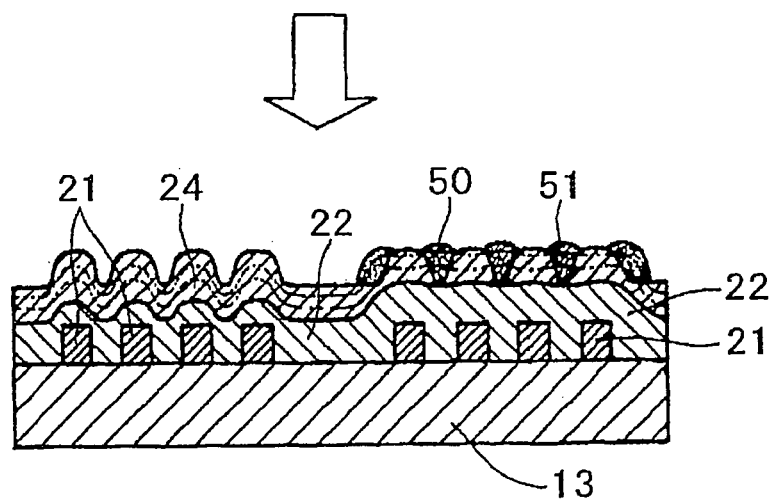

More specifically, as shown in FIGS. 8A and 8B, the laser light is irradiated to the depressions 50 adjacent to the protrusions 23 and forming aggregation trace 51 within the depressions 50. Next, the depressions 50 are filled up to a level substantially equal to the protrusions 23, and then polishing there including the protrusions 23 as the same work surface is conducted. In this manner, while preventing removal of the material at the bottom of the depressions 50, a high flatness is achieved when the polishing is completed.

Figure 7:
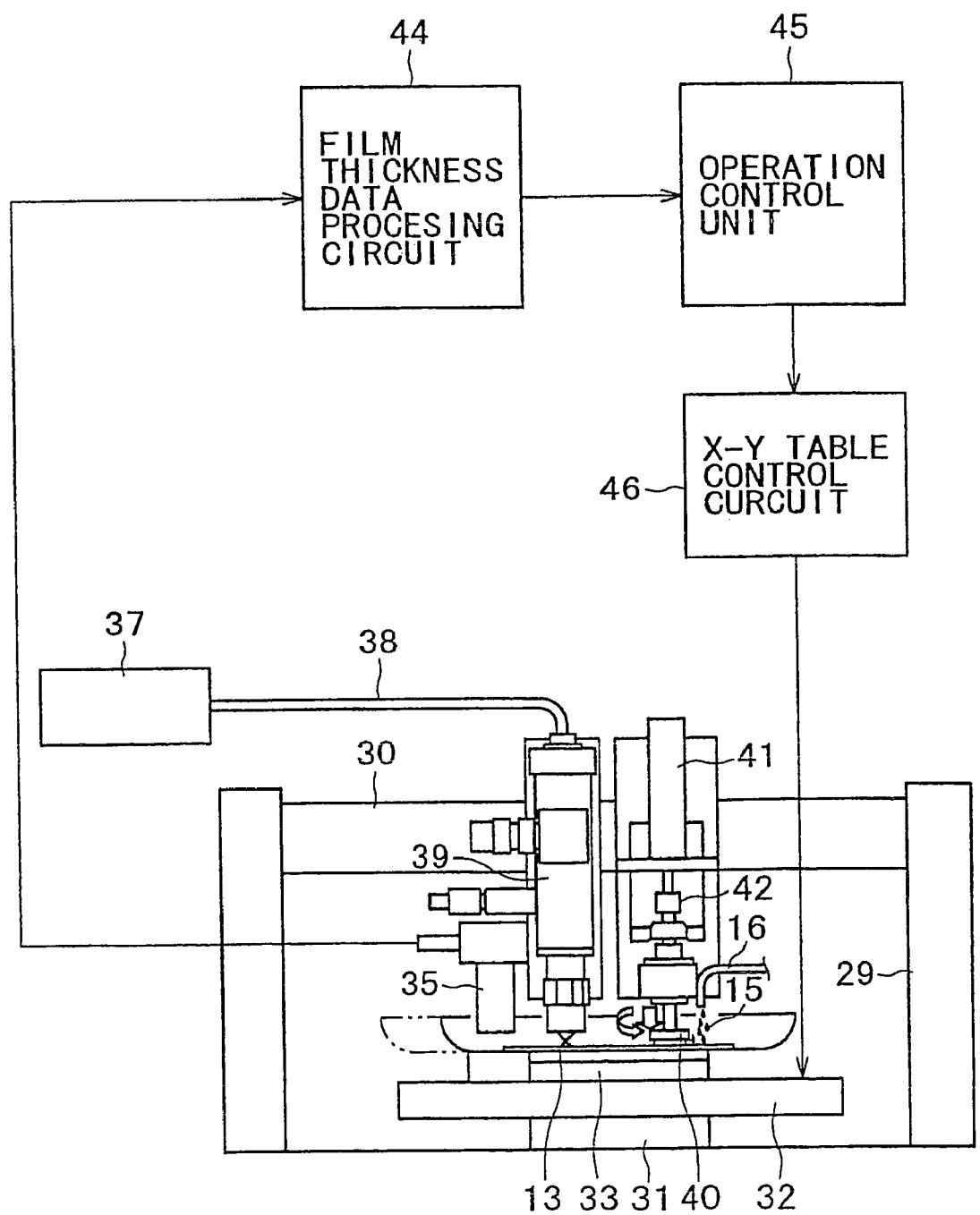
FIG. 7 is a front view of a polishing apparatus.

FIG. 7 shows the outline of an apparatus for realizing such a polishing method. The apparatus is configured of a frame 29 and a stay 30, and its lower region is formed of a base 31. A moving stage 32 formed of an X-Y table is placed on the base 31. An adsorption-fixing unit 33 is provided on the moving stage 32 for absorbing to hold the silicon wafer 13.

A film thickness measuring unit 35 is placed over the suction-fixing unit 33. The apparatus also has an Yttrium Aluminum Garnet (YAG) laser 37 which is connected to a laser light projection optical system 39 through an optical fiber 38. A polishing tool 40 is placed on the side of the optical system 39 and is coupled to an air pressure cylinder 41. An electric motor 42 is placed on the output side of the air pressure cylinder 41. A slurry supply unit 16 is attached to the side of the polishing tool 40 to supply the slurry 15.

The film thickness measuring unit 35 is connected to a film thickness data processing circuit 44 which is connected to an operation control unit 45. The operation control unit 45 is connected to an X-Y table control circuit 46 which controls the driving of the moving stage 32 formed of the X-Y table.

Next, the operation of polishing with the apparatus is described. The silicon wafer 13 which is a workpiece is fixed by vacuum absorption through the suction-fixing unit 33 onto the moving stage 32 formed of the X-Y table movable in the X-Y directions in a horizontal plane.

Then, the moving stage 32 moves to the left in FIG. 7, that is, to below the film thickness measurement unit 35 based on an instruction from the X-Y table control circuit 46. The film thickness on the surface of the workpiece 13 is measured by the film thickness measurement unit 35 configured of a multiple interferometer positioned above the workpiece 13. The data of the film thickness are sent to the film thickness data processing circuit 44 together with coordinate values on the X-Y plane of the moving stage 32, processed by the processing circuit 44, and then sent to the operation control unit 45 which stores the data. Such measurements of the film thickness are made at very narrow intervals over the entire surface of the workpiece 13 to measure the shape of protrusions and depressions of the surface of the workpiece 13.

Next, the slurry supply unit 16 supplies the slurry 15 containing particles and chemical for polishing to the surface of the workpiece 13. Then, the moving stage 32 is moved to below the laser light projection optical system 39 based on an instruction from the control circuit 46. The YAG laser 37 emits laser light flux which passes through the optical fiber 38 and is irradiated to a predetermined region on the surface of the workpiece 13 through the projection optical system 39 arranged above the workpiece 13.

At this time, the laser light is irradiated to only the depressions 50 adjacent to the protrusions 23 of the surface over the wiring pattern 21 on the silicon wafer 13 shown in FIG. 2, in accordance with the previously measured surface shape of the workpiece 13. The laser light is irradiated as single light flux to scan the surface of the workpiece 13 with the movement of the moving stage 32.

Then, the moving stage 32 is moved to below the polishing tool 40, based on an output signal from the X-Y table control circuit 46. The polishing tool 40 performs polishing with feed movement of the moving stage 32 by using the air pressure cylinder 41 and the electric motor 42 to apply pressure and make rotational movement simultaneously.

In this event, as shown in FIG. 8A, the laser light is irradiated to the surface of the workpiece 13 to cause a laser trapping phenomenon on the surface of the workpiece 13 which allows the particles of the slurry 15 to be aggregated and deposited within the depressions 50 adjacent to the protrusions 23.

When the laser light is irradiated to the slurry 15 containing the particles, the particles are trapped by the laser light flux with the light radiation pressure. This phenomenon is known as laser trapping. When the laser light flux is used to scan the surface of the silicon wafer 13 supplied with the slurry 15, the particles are collected and solidified on the scan trace as shown in FIG. 8. This is the laser trapping phenomenon. Polishing is performed after the aggregation trace of particles is formed within the depressions 50 adjacent to the protrusions 23 at the silicon wafer 13. Thus, the polishing is locally performed around the aggregation trace 51 and the protrusions 23, and, consequently, only the protrusions 23 on the surface corresponding to the small wiring pattern 21 are removed.

Simultaneously with the irradiation of the laser light, a relatively soft chemical reaction layer is formed on the surface of the workpiece 13 by a chemical reaction between the thin film layer 22 and the chemical in the slurry. Especially, a chemical reaction layer is quickly formed by an active chemical reaction at the laser light irradiated region.

Specifically, when the laser light flux is irradiated to the silicon wafer 13 supplied with the slurry 15, the chemical reaction layer is actively formed on the surface due to a temperature rise or the like at the irradiated region. The chemical reaction layer is considered as a hydration layer. After the active formation of the hydration layer by the irradiation of the laser light, polishing with the slurry 15 is performed to remove the hydration layer, thereby especially increasing the removing speed at which the protrusions 23 of the surface.

As the composition of the slurry 15 used for the polishing in the embodiment, the following combination can be used: grains (particles) dispersion liquid

| grains (particles) | dispersion liquid |
|---|---|
| $SiO_2$ | KOH |
| $CeO_2$ | $H_2O$ |
| $SiO_2$ | $NH_4OH$ |
| $Al_2O_3$ | KOH |

Since the laser light projection optical system 39 can easily narrow the laser light flux to approximately the width of the wiring pattern 21, selective polishing is possible even on the protrusions 23 having a very small width. With such a process, high precision planarization can be performed for the interlayer insulating film 22 having the fine protrusions and depressions of the silicon wafer 13 such that the selective removal material amount of the thin film layer 22 can be removed as shown by reference numeral 24 in FIG. 4. As a result, ideal polishing can be performed with extremely high flatness.

This processing method of the embodiment can use the same mechanism to realize high precision flatness, not only for the interlayer insulating film 22 of $SiO_2$ on the silicon wafer 13 but also for a metal film formed on the silicon wafer 13, such as a metal film made of copper in a dual damascene process. The processing method of the embodiment can also be applied to polishing of a workpiece at its specific region with a small polishing tool such as polishing of an aspheric lens. In such a case, high precision processing is realized by improving the positional resolutions in a work surface.

According to the apparatus, especially shown in FIG. 7 of the embodiment, and the polishing method performed by this apparatus, polishing is performed with high precision positional resolutions when the specific region of the workpiece, such as the silicon wafer 13, is polished with the small tool. In a planarization process with the CMP method, for a surface having fine protrusions and depressions thereon in a semiconductor process, selectively polishing the protrusions 23 is possible. Thus, an ideal high flatness as shown in FIG. 4 can be achieved.

The polishing apparatus and the polishing method of the embodiment allow planarization of the interlayer insulating film 22 on the silicon wafer 13 mainly made of a $SiO_2$, as described above, and also allow planarization of a metal film made of Cu or the like. In addition, if the apparatus and the method of the embodiment are used when polishing a surface of an aspheric lens or the like, high precision polishing is realized.

In the above-mentioned embodiment, the laser optical system 39 narrows and selectively irradiates the laser light to the depressions adjacent to protrusions 23 of the thin film layer 22 on the silicon wafer 13. In this event, the laser light is irradiated while scanning is performed with the X-Y table 32. Instead of such a configuration, a light shield mask 58 may be used in order to irradiate the laser light selectivity without performing scanning.

Figure 9:
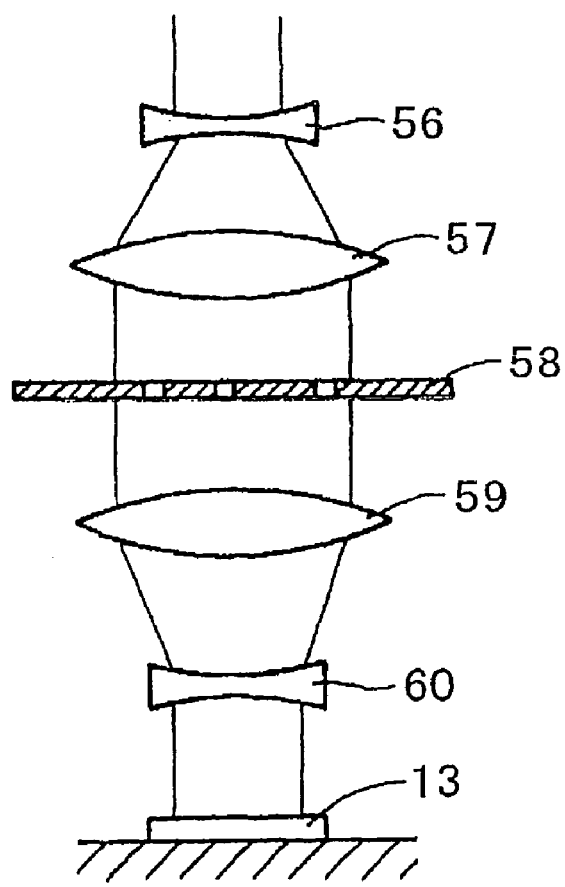
FIG. 9 is a sectional view of main regions of a laser optical system using a light shield mask.

FIG. 9 shows such an apparatus including an expander lens 56, a focusing lens 57, a light shield mask 58, a focusing lens 59, and a concave lens 60 which are arranged in a laser optical system.

The laser light is diffused by the expander lens 56, changed to parallel light by the focusing lens 57, passed through the light shield mask 58, then narrowed by the focusing lens 59, changed to parallel light by the concave lens 60, and finally projected onto the surface of the silicon wafer 13. With the projection performed in this manner, the laser light is irradiated to the surface of the silicon wafer 13 in accordance with the pattern shape of the light shield mask 58. Thus, the laser light can be irradiated selectively only to the depressions 50 adjacent to the protrusions 23 of the surface of the thin film layer 22 on the silicon wafer 13, without performing laser irradiation, while scanning is performed with the X-Y table 32 and the laser light projection optical system 39.

EXAMPLE

Figure 10:
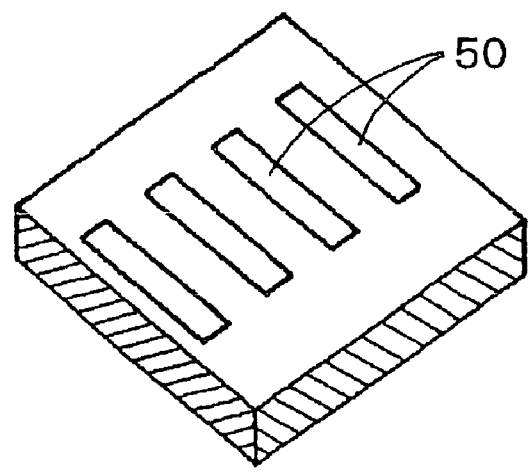
FIG. 10 is a perspective view showing the outer appearance of a sample of a silicon wafer having depressions formed on its surface.
Figure 11:
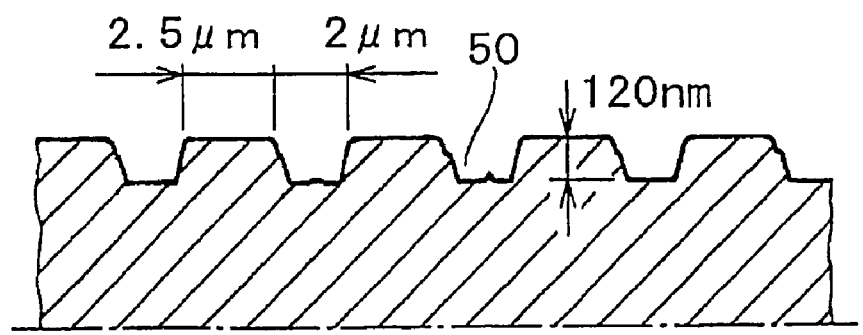
FIG. 11 is an enlarged sectional view of main regions of the silicon wafer shown in FIG. 10.

In this example, a sample is provided that a silicon wafer having depressions 50, which is a pattern of protrusions and depressions formed through a FIB (Focused Ion Beam) process on the surface, as shown in FIG. 10. FIG. 11 shows a sectional shape of the sample measured by an AFM (Atomic Force Microscope) Four depressions 50 were formed at intervals of approximately 2.5 μm, with a width of approximately 2 μm, a depth of approximately 60 to 120 nm, and a length of approximately 10 μm.

An experimental laser irradiation apparatus used in this example was an $Ar^+$ laser with a wavelength of 488 nm as a laser light source, and it irradiated the laser light to the sample through an objective lens. An experimental polishing apparatus developed for performing this example was used. Table 1 shows laser irradiation conditions and polishing conditions.

TABLE 1

| | |
|---|---|
| sample | silicon wafer with SiO₂ film/ trench fabricated by FIB method |
| slurry | SiO₂/partile diameter of 140 nm/ dilution rate 3% ILD1200 (Rodel Nitta) |
| laser | Ar⁺ laser (λ = 488 nm), 100 to 150 mW Beamlock (Spectra Physics) |
| polishing conditions | rotation speed 100 rpm<br>polishing pressure 0.025 Mpa<br>polishing pad IC1000, φ20<br>X–Y stage moving speed 40 mm/min |

Figure 12A:
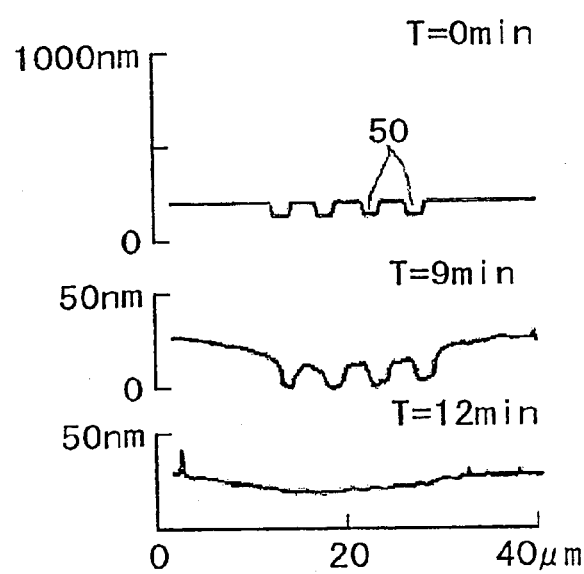
FIGS. 12A and 12B are graphs illustrating the progression of planarization through the polishing process.
Figure 12B:
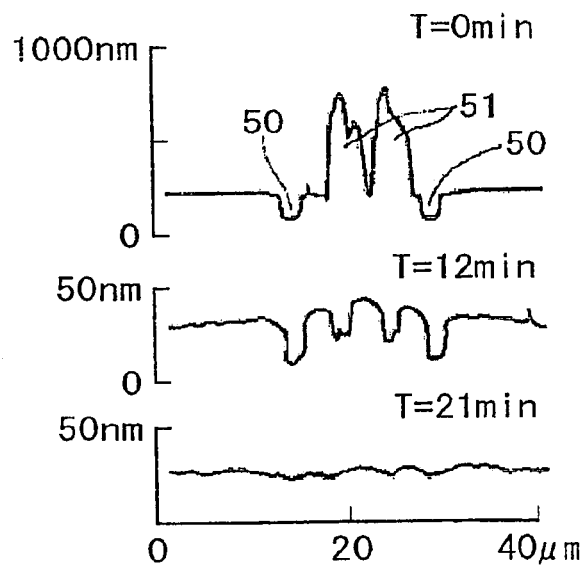

FIGS. 12A and 12B show the results of an example of a planarization experiment with an LAFP (Laser Aggregation, Filling-up & Polishing) method. FIG. 12A shows graphs illustrating the results of polishing of the sample having protrusions and depressions through the FIB processing. The trenches 50 initially having a depth of 60 nm were becoming rounder at their edges as the polishing proceeded, and the whole trenches 50 were polished. The original shape of the trenches remained even when the polishing was continued, and finally, the whole trenches became a concave shape with approximately 10 nm depth.

FIG. 12B shows graphs illustrating the results of polishing the two central depressions 50 having the aggregation trace 51 of the four depressions 50 with a depth of approximately 122 nm. Since the depressions 50 was filled up the aggregation trace 51 before the start of the polishing, they were polished as the same plane as the surroundings, and the polishing proceeded without maintaining the trench shape. The experiment revealed that, when the polishing plane reached the bottom of the depressions 50, the initial shape of the protrusions and depressions was eliminated, and realized a flat surface having fine protrusions and depressions of only approximately 3 nm height differences.

Therefore, as described above, the experimental results can ensure that a surface having protrusions and depressions thereon can be planarized in the following manner. The depressions 50 were formed on the surface of the silicon wafer through the FBI processing, the depressions 50 were subjected to the laser light irradiation to form the aggregation trace 51, and then polishing was performed on the region where the aggregation trace 51 were formed, thereby making it possible to form the flat polishing surface.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

The invention claimed is:

1. A polishing apparatus for polishing a work surface having protrusions and depressions thereon with slurry containing particles, comprising:
a moving stage on which the work surface is mounted;
a processing circuit that generates coordinate values of the work surface by associating work surface measurements with coordinates of the moving stage;
an operational control unit that stores the generated coordinate values;
a stage control circuit that adjusts the position of the moving stage based on the coordinate values stored in the operational control unit;
a laser optical system that scans the work surface by selectively projecting and irradiating laser light onto the work surface; and
a polishing tool system that applies pressure to the work surface in an axial direction and provides rotational movement,
wherein the stage control circuit adjusts the position of the moving stage as the laser optical system scans laser light onto the depressions of the work surface, so that the polishing particles of the slurry are aggregated in the depressions.

2. The polishing apparatus according to claim 1, wherein: the shape of said surface of said region to be polished on said work surface is measured by shape measuring means before or during polishing; the measured shape is stored by storing means; a laser light irradiation region, an irradiation condition, and a polishing condition are calculated from the stored measurement data; and based on the calculation result, said laser optical system irradiates laser to said depressions adjacent to said protrusions or said polishing tool system polishes said protrusions and said depressions.

3. The polishing apparatus according to claim 1, wherein a light shield mask is placed in an optical path of said laser optical system in order to irradiate laser light selectively in accordance with the shape of said protrusions and said depressions of said work surface.

* * * * *